(12) United States Patent
Hirai et al.

(10) Patent No.: US 10,832,930 B2
(45) Date of Patent: Nov. 10, 2020

(54) ELECTROSTATIC ATTRACTION METHOD

(71) Applicant: TOKYO ELECTRON LIMITED, Tokyo (JP)

(72) Inventors: Katsunori Hirai, Miyagi (JP); Yasuharu Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 89 days.

(21) Appl. No.: 16/009,759

(22) Filed: Jun. 15, 2018

(65) Prior Publication Data
US 2018/0366360 A1 Dec. 20, 2018

(30) Foreign Application Priority Data
Jun. 16, 2017 (JP) ................................ 2017-119043

(51) Int. Cl.
*H01L 21/683* (2006.01)
*H01J 37/32* (2006.01)

(52) U.S. Cl.
CPC .... *H01L 21/6831* (2013.01); *H01J 37/32706* (2013.01); *H01L 21/6833* (2013.01); *H01J 37/32091* (2013.01)

(58) Field of Classification Search
CPC ........................ H01L 21/6831; H01L 21/6833
See application file for complete search history.

(56) References Cited

U.S. PATENT DOCUMENTS

| | | | | |
|---|---|---|---|---|
| 5,117,121 A | * | 5/1992 | Watanabe | B23Q 3/15 307/130 |
| 6,185,085 B1 | * | 2/2001 | Hwang | H01L 21/6831 361/234 |
| 6,898,064 B1 | * | 5/2005 | Berman | H01L 21/6831 361/233 |
| D587,222 S | * | 2/2009 | Sasaki | D13/182 |
| 2005/0103275 A1 | * | 5/2005 | Sasaki | H01J 37/32706 118/728 |
| 2015/0069910 A1 | * | 3/2015 | Iwata | H01J 37/32697 315/111.21 |
| 2015/0135514 A1 | * | 5/2015 | Sasaki | H01L 21/6833 29/559 |
| 2016/0189994 A1 | * | 6/2016 | Sasaki | H01L 21/67109 361/234 |
| 2018/0308738 A1 | * | 10/2018 | Tobe | H01J 37/32642 |

FOREIGN PATENT DOCUMENTS

| | | |
|---|---|---|
| JP | 63-361381 A | 2/1988 |
| JP | 9-120988 A | 5/1997 |

* cited by examiner

Primary Examiner — Mohammed Shamsuzzaman
Assistant Examiner — Khatib A Rahman
(74) Attorney, Agent, or Firm — Rothwell, Figg, Ernst & Manebeck, P.C.

(57) ABSTRACT

Disclosed is an electrostatic attraction method including: a first step in which a gas is introduced into a chamber in which the processing target object is to be processed before a processing target object is placed on a stage within the chamber, and plasma is generated by applying a high frequency power; a second step in which a DC voltage having a polarity opposite to a polarity of a DC voltage to be applied when attracting the processing target object, to an electrostatic chuck provided on the stage after the first step; a third step where extinguishing of the plasma by stopping application of the high frequency power is performed after the second step; and a fourth step where application of the DC voltage is stopped after the third step.

14 Claims, 8 Drawing Sheets

(a-1)

(a-2)

(b-1)

(b-2)

(b-3)

ELECTROSTATIC ATTRACTION METHOD

CROSS-REFERENCE TO RELATED APPLICATION

This application is based on and claims priority from Japanese Patent Application No. 2017-119043 filed on Jun. 16, 2017 with the Japan Patent Office, the disclosure of which is incorporated herein in its entirety by reference.

TECHNICAL FIELD

The present disclosure relates to an electrostatic attraction method.

BACKGROUND

An electrostatic chuck is provided on a stage within a chamber. The electrostatic chuck electrostatically attracts and holds a processing target object on the electrostatic chuck by a Coulomb force generated by a DC voltage output from a DC power supply (see, e.g., Japanese Patent Laid-Open Publication Nos. 63-036138 and 09-120988).

For example, Japanese Patent Laid-Open Publication No. 63-036138 proposes a method of removing charges of an electrostatic chuck. Japanese Patent Laid-Open Publication No. 09-120988 proposes a technique in which before a subsequent wafer is attracted to an electrostatic chuck, a negative DC voltage is applied to the electrostatic chuck to perform current discharge on the electrostatic chuck in a state where nitrogen gas is introduced into a processing chamber, thereby preventing defective attraction of the wafer to the electrostatic chuck.

SUMMARY

According to an aspect, an electrostatic attraction method includes: a first step in which a gas is introduced into a chamber in which the processing target object is to be processed before a processing target object is placed on a stage within the chamber, and plasma is generated by applying a high frequency power; a second step in which a DC voltage having a polarity opposite to a polarity of a DC voltage to be applied when attracting the processing target object, to an electrostatic chuck provided on the stage after the first step; a third step where extinguishing of the plasma by stopping application of the high frequency power is performed after the second step; and a fourth step where application of the DC voltage is stopped after the third step.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
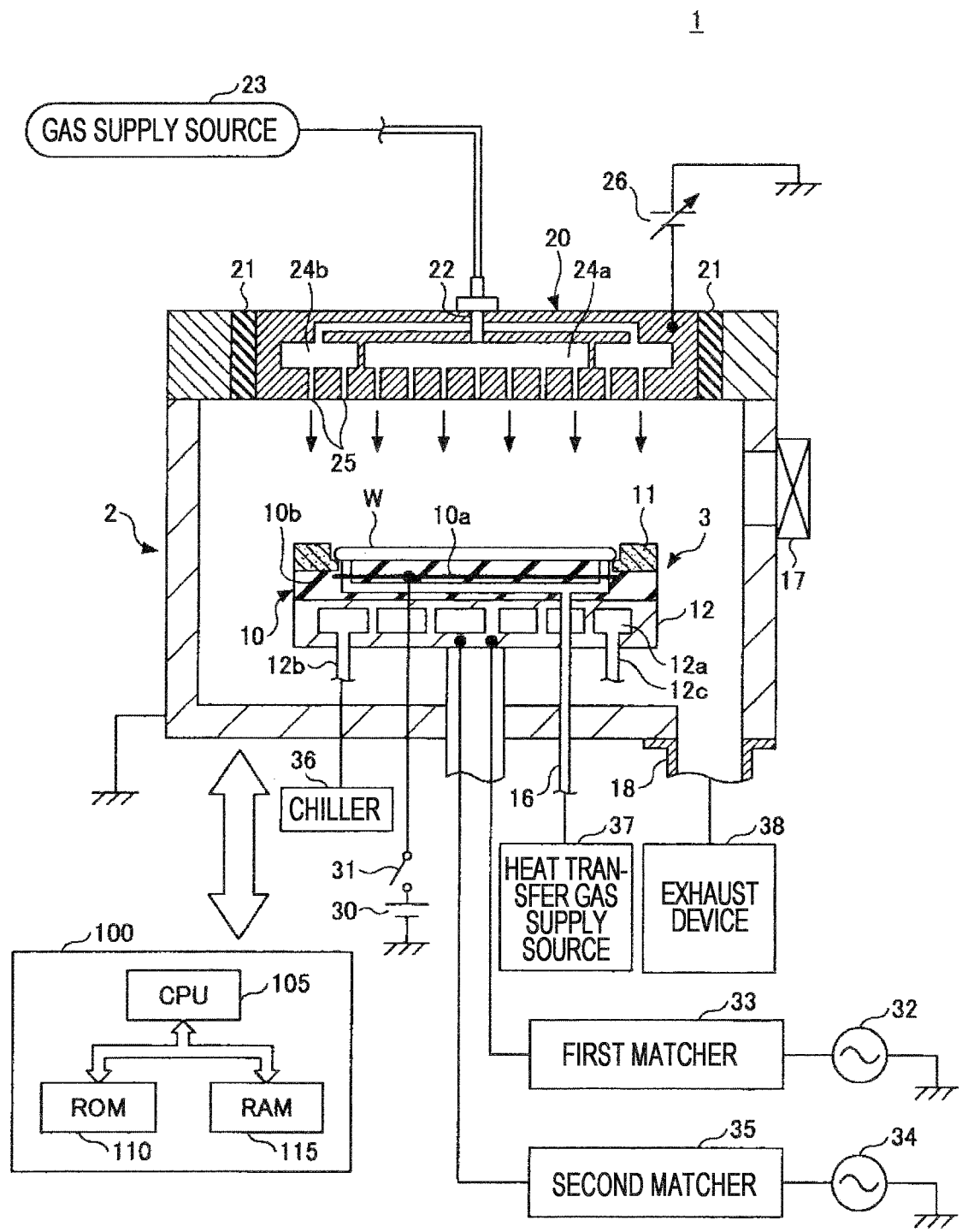
FIG. 1 is a view illustrating an example of a plasma processing apparatus according to an exemplary embodiment.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Even when a subsequent wafer is loaded and attracted to an electrostatic chuck after residual charges occurring on a front surface of the electrostatic chuck during a processing of an immediately preceding wafer are removed, a heat transfer gas supplied between the wafer and the electrostatic chuck may be leaked. In this case, it is required to further increase an attraction force of the electrostatic chuck, thereby preventing a leakage of the heat transfer gas.

Meanwhile, increasing a power of a DC voltage applied to an electrostatic chuck is taken into consideration to increase an attraction force. However, there is a demand to prevent a leakage of a heat transfer gas by increasing an attraction force of an electrostatic chuck without increasing a power of a DC voltage, so that a use of more resources than necessary is avoided and a running cost is suppressed.

With respect to the above matters, in an aspect, the present disclosure is to increase an attraction force of an electrostatic chuck without increasing a power of a DC voltage.

In order to solve the matters, according to an aspect, an electrostatic attraction method includes: a first step in which a gas is introduced into a chamber in which the processing target object is to be processed before a processing target object is placed on a stage within the chamber, and plasma is generated by applying a high frequency power; a second step in which a DC voltage having a polarity opposite to a polarity of a DC voltage to be applied when attracting the processing target object, to an electrostatic chuck provided on the stage after the first step; a third step where extinguishing of the plasma by stopping application of the high frequency power is performed after the second step; and a fourth step where application of the DC voltage is stopped after the third step.

The above-described electrostatic attraction method further includes, after the fourth step, a fifth step in which the processing target object is carried into the chamber and a DC voltage having a polarity opposite to the polarity of the DC voltage applied in the second step, to the electrostatic chuck so that the processing target object is attracted to the electrostatic chuck.

In the above-described electrostatic attraction method, the DC voltage applied in the second step is a DC voltage having a negative polarity.

In the above-described electrostatic attraction method, the DC voltage applied in the fifth step is a DC voltage having a positive polarity.

In the above-described electrostatic attraction method, wherein the high frequency power applied in the first step is a high frequency power for plasma generation.

In the above-described electrostatic attraction method, the pressure within the chamber is lowered simultaneously when or after the application of the high frequency power is stopped in the third step and before the fourth step.

In the above-described electrostatic attraction method, the first step is performed after a wafer-less dry cleaning.

According to another aspect of the present disclosure, an electrostatic attraction method includes: a first step in which a gas is introduced into a chamber in which the processing target object is to be processed before a processing target object is placed on a stage within the chamber, and plasma is generated by applying a high frequency power; a second step in which a DC voltage having a polarity opposite to a polarity of a DC voltage to be applied when attracting the processing target object, to an electrostatic chuck provided on the stage after the first step; a third step where extinguishing of the plasma by stopping application of the high frequency power is performed after the second step; a fourth step where application of the DC voltage is stopped after the third step; and after the fourth step, a fifth step in which the processing target object is carried into the chamber and a DC voltage having a polarity opposite to the polarity of the DC voltage applied in the second step, to the electrostatic chuck so that the processing target object is attracted to the electrostatic chuck.

According to still another aspect of the present disclosure, an electrostatic attraction method includes: a first step in which a gas is introduced into a chamber in which the processing target object is to be processed before a processing target object is placed on a stage within the chamber, and a pressure within the chamber is increased; a second step in which a DC voltage having a polarity opposite to a polarity of a DC voltage to be applied when attracting the processing target object, to an electrostatic chuck provided on the stage after the first step; a third step where lowering of the pressure within the chamber is performed after the second step; and a fourth step where application of the DC voltage is stopped after the third step; and after the fourth step.

According to an aspect, it is possible to increase an attraction force of the electrostatic chuck without increasing the power of a DC voltage.

Hereinafter, exemplary embodiments of the present disclosure will be described with reference to the accompanying drawings. Meanwhile, in the present specification and drawings, substantially the same components are denoted by the same symbols and redundant explanations thereof will be omitted.

[Overall Configuration of Plasma Processing Apparatus]

First, an example of a plasma processing apparatus 1 will be described with reference to FIG. 1. The plasma processing apparatus 1 according to the present exemplary embodiment is a capacitively coupled parallel plate plasma processing apparatus, and includes a substantially cylindrical chamber (processing container) 2. The inner surface of the chamber 2 has been subjected to an alumite treatment (an anodizing treatment). The interior of the chamber 2 becomes a processing chamber where a plasma processing such as, for example, an etching processing or a film forming processing is performed by plasma.

On a stage 3, a semiconductor wafer (hereinafter, referred to as a "wafer") as an example of a substrate is placed. The stage 3 is made of, for example, aluminum (Al), titanium (Ti), or silicon carbide (SiC). The stage 3 also functions as a lower electrode.

An electrostatic chuck (ESC) 10 is provided at the top side of the stage 3 to electrostatically attract the wafer W. The electrostatic chuck 10 has a structure in which a chuck electrode 10a is interposed between insulators 10b. A DC power supply 30 is connected to the chuck electrode 10a. When a DC voltage is applied from the DC power supply 30 to the chuck electrode 10a by opening and closing a switch 31, the wafer W is attracted to the electrostatic chuck 10 by a Coulomb force.

An annular focus ring 11 is placed at an outer periphery side of the electrostatic chuck 10 to surround an outer edge portion of the wafer W. The focus ring 11 is made of, for example, silicon, and functions to cause plasma to converge toward the surface of the wafer W in the chamber 2, thereby improving the efficiency of a plasma processing.

A lower side portion of the stage 3 becomes a support 12, by which the stage 3 is held at the bottom portion of the chamber 2. A refrigerant flow path 12a is formed inside the support 12. A cooling medium (hereinafter, also referred to as a "refrigerant") such as, for example, cooling water or brine, output from a chiller 36 flows and circulates through a refrigerant inlet pipe 12b, the refrigerant flow path 12a, and a refrigerant outlet pipe 12c. By the refrigerant circulating in this manner, the stage 3 made of a metal releases heat, and is cooled.

A heat transfer gas supply source 37 supplies a heat transfer gas such as, for example, a helium gas (He) between the front surface of the electrostatic chuck 10 and the rear surface of the wafer W through a heat transfer gas supply line 16. Through such a configuration, the temperature of the electrostatic chuck 10 is controlled by the refrigerant circulating through the refrigerant flow path 12a and the heat transfer gas supplied to the rear surface of the wafer W. As a result, the wafer W may be controlled at a predetermined temperature.

A first high frequency power supply 32 is connected to the stage 3 through a first matcher 33 to supply a high frequency power HF at a first frequency which is used for plasma generation. A second high frequency power supply 34 is connected to the stage 3 through a second matcher 35 to supply a high frequency power LF at a second frequency which is used for bias voltage generation. The first frequency may be, for example, 40 MHz. The second frequency is lower than the first frequency, and may be, for example, 13.56 MHz. In the present exemplary embodiment, the high frequency power HF is applied to the stage 3, but may be applied to a gas shower head 20.

The first matcher 33 matches a load impedance to an internal (or output) impedance of the first high frequency power supply 32. The second matcher 35 matches a load impedance to an internal (or output) impedance of the second high frequency power supply 34. The first matcher 33 functions to make the internal impedance of the first high frequency power supply 32 apparently coincide with the load impedance when plasma is generated within the chamber 2. The second matcher 35 functions to make the internal impedance of the second high frequency power supply 34 apparently coincide with the load impedance when plasma is generated within the chamber 2.

The gas shower head 20 is attached to block an opening at a ceiling portion of the chamber 2 through a shield ring 21 covering an outer edge portion of the gas shower head 20. A variable DC power supply 26 is connected to the gas shower head 20, and a negative DC voltage (DC) is output from the variable DC power supply 26. The gas shower head 20 may be made of silicon. The gas shower head 20 also functions as a counter electrode (an upper electrode) facing the stage 3 (the lower electrode).

A gas introducing port 22 is formed in the gas shower head 20 to introduce a gas. A diffusion chamber 24a at the center side and a diffusion chamber 24b at the edge side, which diverge from the gas introducing port 22, are formed within the gas shower head 20. A gas output from a gas supply source 23 is supplied to the diffusion chambers 24a and 24b through the gas introducing port 22, diffused in the diffusion chambers 24a and 24b and then introduced from a plurality of gas supply holes 25 toward the stage 3.

An exhaust port 18 is formed in a bottom surface of the chamber 2, and the inside of the chamber 2 is exhausted by an exhaust device 38 connected to the exhaust port 18. Accordingly, the inside of the chamber 2 may be maintained at a predetermined degree of vacuum. A gate valve 17 is provided on a side wall of the chamber 2. The gate valve 17 is opened and closed when the wafer W is carried into the chamber 2 or carried out of the chamber 2.

A control device 100 is provided in the plasma processing apparatus 1 to control the operation of the entire apparatus. The control device 100 includes a central processing unit (CPU) 105, a read only memory (ROM) 110, and a random access memory (RAM) 115. The CPU 105 executes a desired plasma processing such as, for example, etching, according to a recipe stored in a storage area of, for example, the RAM 115. In the recipe, for example, a process time, a pressure (exhaust of a gas), a high frequency power or voltage, various gas flow rates, a temperature within a processing container [for example, an upper electrode temperature, a side wall temperature of a processing container, a wafer W temperature, and an electrostatic chuck temperature], and a temperature of a refrigerant output from the chiller 36 are set as apparatus control information on process conditions. Meanwhile, the recipe indicating these programs or processing conditions may be stored in a hard disk or a semiconductor memory. The recipe may be set in a predetermined location and read while being stored in a computer-readable portable storage medium such as, for example, a CD-ROM and a DVD.

When a plasma processing such as, for example, etching or film-formation is executed, the opening and closing of the gate valve 17 are controlled, and a wafer W is carried into the chamber 2, and is placed on the stage 3. When a DC voltage having a positive or negative polarity is applied from the DC power supply 30 to the chuck electrode 10a, the wafer W is attracted to and held by the electrostatic chuck 10.

A desired gas is supplied from the gas supply source 23 into the chamber 2. A high frequency power HF is applied from the first high frequency power supply 32 to the stage 3, and a high frequency power LF is applied from the second high frequency power supply 34 to the stage 3. A negative DC voltage is applied from the variable DC power supply 26 to the gas shower head 20. Accordingly, a gas is decomposed above the wafer W to generate plasma, and a plasma processing is performed on the wafer W by the action of the plasma.

After the plasma processing, a DC voltage having a polarity opposite to that applied when attracting the wafer W is applied from the DC power supply 30 to the chuck electrode 10a, and charges of the wafer W are eliminated. After the charge elimination, the wafer W is separated from the electrostatic chuck 10, and is carried out of the chamber 2 through the gate valve 17.

[Precharge]

Figure 2:
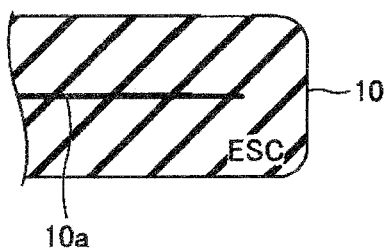
FIG. 2 is a view for explaining a difference in an attraction force between presence and absence of precharge in the exemplary embodiment.
Figure 2:
Figure 2:
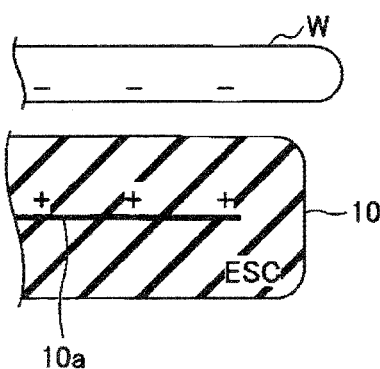
Figure 2:
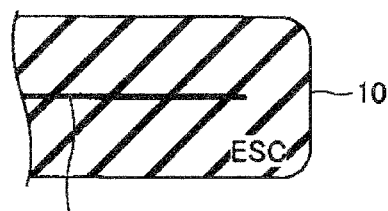
Figure 2:
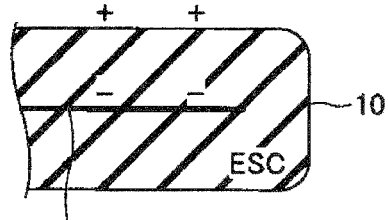
Figure 2:
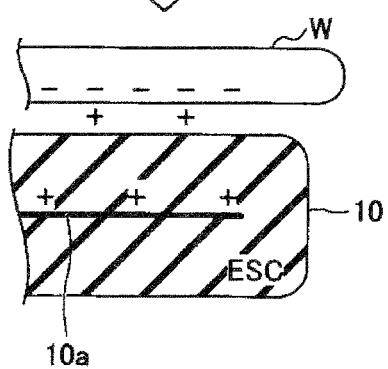

Next, descriptions will be made on a difference in an attraction force between the presence and absence of precharge, in the exemplary embodiment of the present disclosure, with reference to FIG. 2. FIG. 2 is a view for explaining a relationship between the presence or absence of precharge and the attraction force in the present exemplary embodiment. In the plasma processing apparatus 1 according to the present exemplary embodiment, immediately before a new wafer (a subsequent wafer) is carried into the chamber 2, a DC voltage HV having a polarity opposite to that of a DC voltage HV to be applied when the subsequent wafer is attracted is applied to the chuck electrode 10a of the electrostatic chuck 10.

In this manner, immediately before a subsequent wafer is carried into the chamber 2, charging, in advance, the front surface of the electrostatic chuck 10 (to which the wafer W is not yet attracted) by applying, from the DC power supply 30, a DC voltage having a polarity opposite to that applied when attracting the wafer W, will be referred to as "precharge" below.

In a first exemplary embodiment and modifications thereof, descriptions will be made on an electrostatic attraction method in which precharge (hereinafter, also referred to as "plasma precharge") is performed in a state where plasma is generated. Thereafter, in a second exemplary embodiment, descriptions will be made on an electrostatic attraction method in which precharge is performed in a state where plasma is not generated.

In an electrostatic attraction method in a case of a conventional example illustrated in (a-1) and (a-2) of FIG. 2, in which precharge is not performed, as illustrated in (a-1) of FIG. 2, the front surface of the electrostatic chuck 10 has not been charged in advance immediately before a subsequent wafer is loaded. That is, it is assumed that there is no charge on the front surface of the electrostatic chuck 10.

When the subsequent wafer W is loaded in this state, and a DC voltage having a positive or negative polarity to be applied when the wafer is attracted is applied from the DC power supply 30 to the chuck electrode 10a, positive or negative charges are also charged on the front surface of the electrostatic chuck 10.

In (a-2) of FIG. 2, an example is illustrated in which a DC voltage HV having a positive polarity is applied from the DC power supply 30 to the chuck electrode 10a, and negative charges occur on the rear surface of the wafer W by being attracted to positive charges of the chuck electrode 10a. Meanwhile, the polarity of the DC voltage HV applied to the chuck electrode 10a may be positive or negative. For example, when a DC voltage HV having a negative polarity is applied from the DC power supply 30 to the chuck electrode 10a, positive charges occur on the rear surface of the wafer W.

In contrast to the above described conventional example, descriptions will be made on the state of charges on the electrostatic chuck 10 and the wafer rear surface in a case where precharge according to the exemplary embodiment is performed, with reference to (b-1) to (b-3) of FIG. 2.

In plasma precharge according to the exemplary embodiment as well, as illustrated in (b-1) of FIG. 2, there is no charge on the front surface of the electrostatic chuck 10 before plasma precharge. In this state, plasma precharge is performed as illustrated in (b-2) of FIG. 2 immediately before a wafer is loaded as illustrated in (b-3) of FIG. 2.

At the plasma precharge, in a state where plasma is generated, a DC voltage HV having a polarity opposite to the polarity to be applied when a following wafer is attracted is applied from the DC power supply 30 to the chuck electrode 10a. Accordingly, positive or negative charges are charged on the front surface of the electrostatic chuck 10. For example, in the example illustrated in (b-2) of FIG. 2, a DC voltage HV having a negative polarity is applied from the DC power supply 30 to the chuck electrode 10a, and positive charges occur on the front surface of the electrostatic chuck 10. This is an example of a precharged state.

When the wafer W is loaded and placed in this state, as illustrated in (b-3) of FIG. 2, a DC voltage HV having a polarity (here, a positive polarity) opposite to that applied during the precharge is applied from the DC power supply 30 to the chuck electrode 10a. Accordingly, to the charges charged on the front surface of the electrostatic chuck 10 during the precharge as illustrated in (b-2) of FIG. 2, charges with the same polarity are added, and the state illustrated in (b-3) of FIG. 2 is made. Accordingly, it can be understood that when the precharge is performed, the amount of charges charged on the front surface of the electrostatic chuck 10 becomes large as compared to a case where the precharge is not performed. As a result, negative charges occurring on the rear surface of the wafer W are attracted to the positive charges charged on the front surface of the electrostatic chuck 10, and increase in an amount. Then, an attraction force between the rear surface of the wafer W and the front surface of the electrostatic chuck 10 may be increased by a Coulomb force.

Meanwhile, during the precharge, the polarity of the DC voltage HV applied to the chuck electrode 10a may be positive or negative as long as the negative or positive polarity is opposite to that of the DC voltage HV to be applied when the wafer W is loaded and attracted. The potential of the DC voltage HV applied to the chuck electrode 10a may or may not be the same as that of the DC voltage HV to be applied when the wafer W is attracted.

First Exemplary Embodiment

[Electrostatic Attraction Process]

Figure 3:
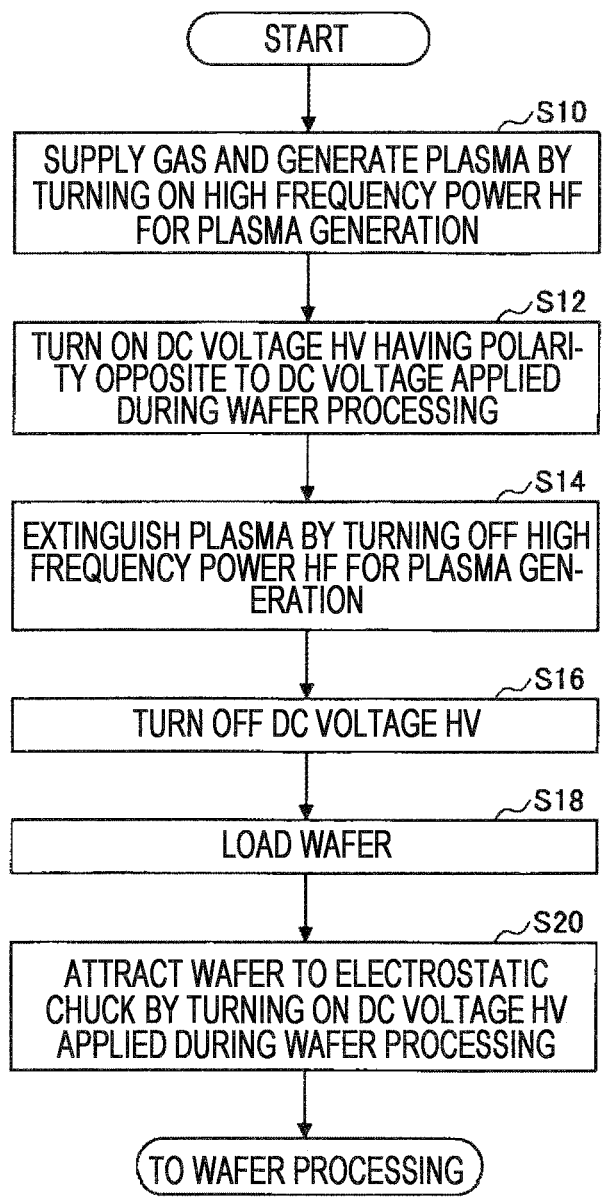
FIG. 3 is a flow chart illustrating an example of an electrostatic attraction process of a wafer according to a first exemplary embodiment.

Next, descriptions will be made on an example of an electrostatic attraction process according to the first exemplary embodiment, with reference to FIG. 3. FIG. 3 is a flow chart illustrating an example of the electrostatic attraction process according to the first exemplary embodiment. This process is executed in the plasma processing apparatus 1 configured as described above, and is controlled by the CPU 105 of the control device 100.

This process is executed after a processed wafer W is carried out of the plasma processing apparatus 1, immediately before a following wafer W is loaded. When this process starts, the gas supply source 23 introduces and supplies nitrogen gas from the gas shower head 20 into the chamber 2. Meanwhile, instead of the nitrogen gas, a rare gas such as, for example, an argon gas, or an oxygen gas may be introduced. The first high frequency power supply 32 applies a high frequency power HF for plasma generation to the stage 3, to generate plasma above the wafer W (step S10). The step S10 is an example of a first step. Meanwhile, the high frequency power LF may or may not be applied.

After step S10, the DC power supply 30 applies a DC voltage HV having polarity opposite to that of a DC voltage HV to be applied from the DC power supply 30 when the wafer W is attracted, to the electrostatic chuck 10 (step S12). The step S12 is an example of a second step.

After step S12, the application of the high frequency power HF for plasma generation is stopped to extinguish the plasma (step S14). The step S14 is an example of a third step.

After step S14, the DC power supply 30 stops the application of the DC voltage HV (step S16). The step S16 is an example of a fourth step. The steps S10 to S16 correspond to an example of plasma precharge performed immediately before the following wafer W is loaded. Accordingly, predetermined charges are precharged on the front surface of the electrostatic chuck 10.

Next, the wafer W is carried into the chamber 2 (step S18), and the DC power supply 30 applies a DC voltage HV to be applied when the wafer W is attracted, to the electrostatic chuck 10 so as to attract the wafer W to the electrostatic chuck 10 (step S20). The steps S18 and S20 correspond to an example of a fifth step. After the processing in step S20, this process is ended.

Figure 4:
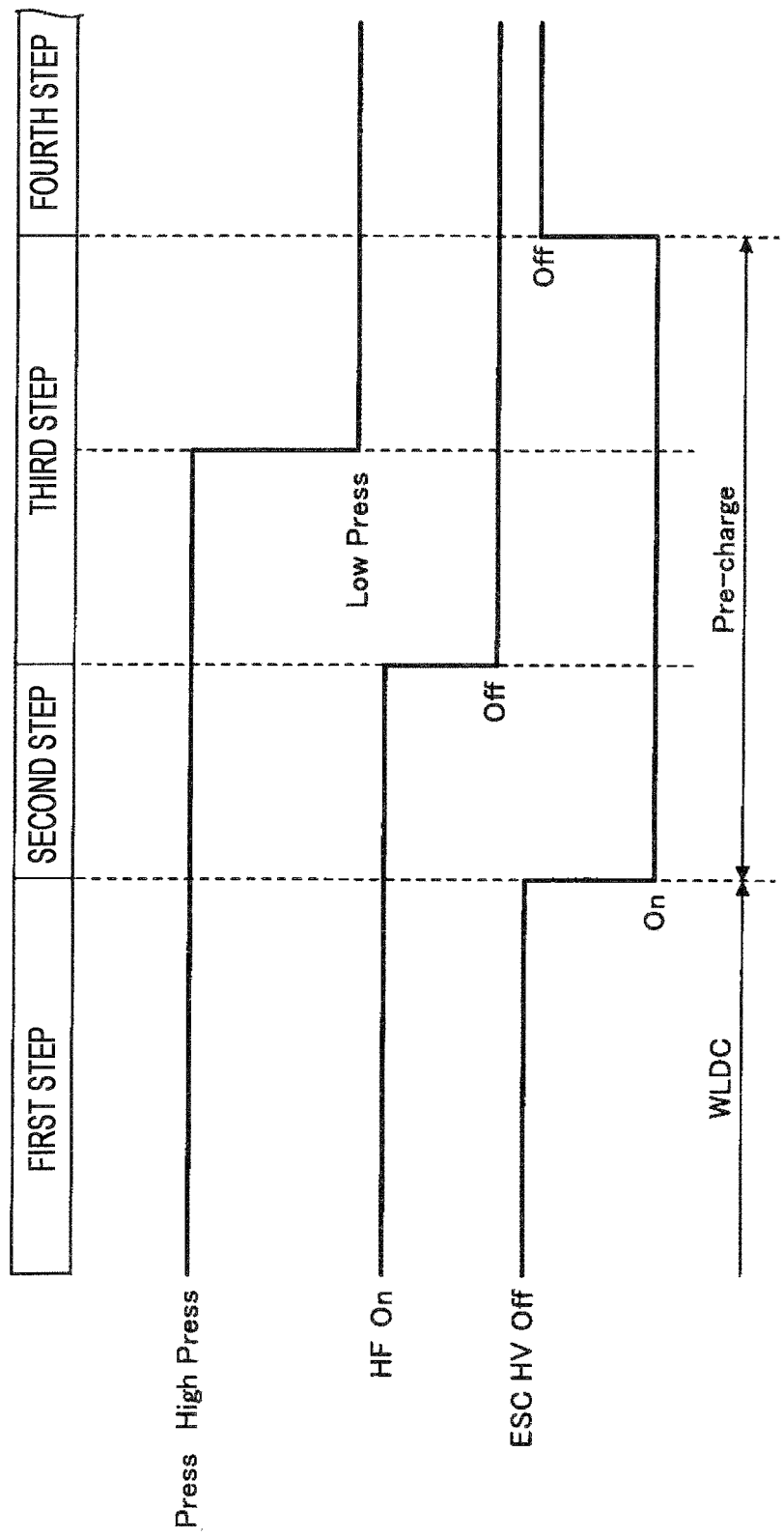
FIG. 4 is a view illustrating an example of a time chart during precharge according to the exemplary embodiment.

In the electrostatic attraction process according to the first exemplary embodiment as described above, as illustrated in FIG. 4, the first step to the fourth step are sequentially executed to perform the plasma precharge. Meanwhile, in the first exemplary embodiment, the pressure control illustrated in FIG. 4 is not performed.

1. First Step

A high frequency power HF for plasma generation is applied to generate plasma.

2. Second Step

To the electrostatic chuck 10, a DC voltage HV having a polarity opposite to that of a DC voltage HV to be applied during the attraction of a subsequent wafer W is applied. In FIG. 4, a DC voltage HV having a negative polarity has been applied.

3. Third Step

The application of the high frequency power HF for plasma generation is stopped, and plasma is extinguished.

4. Fourth Step

The application of the DC voltage HV is stopped.

The state of charges occurring in the electrostatic chuck 10 in each of the above described steps will be described with reference to FIG. 5.

1. First Step

Figure 5:
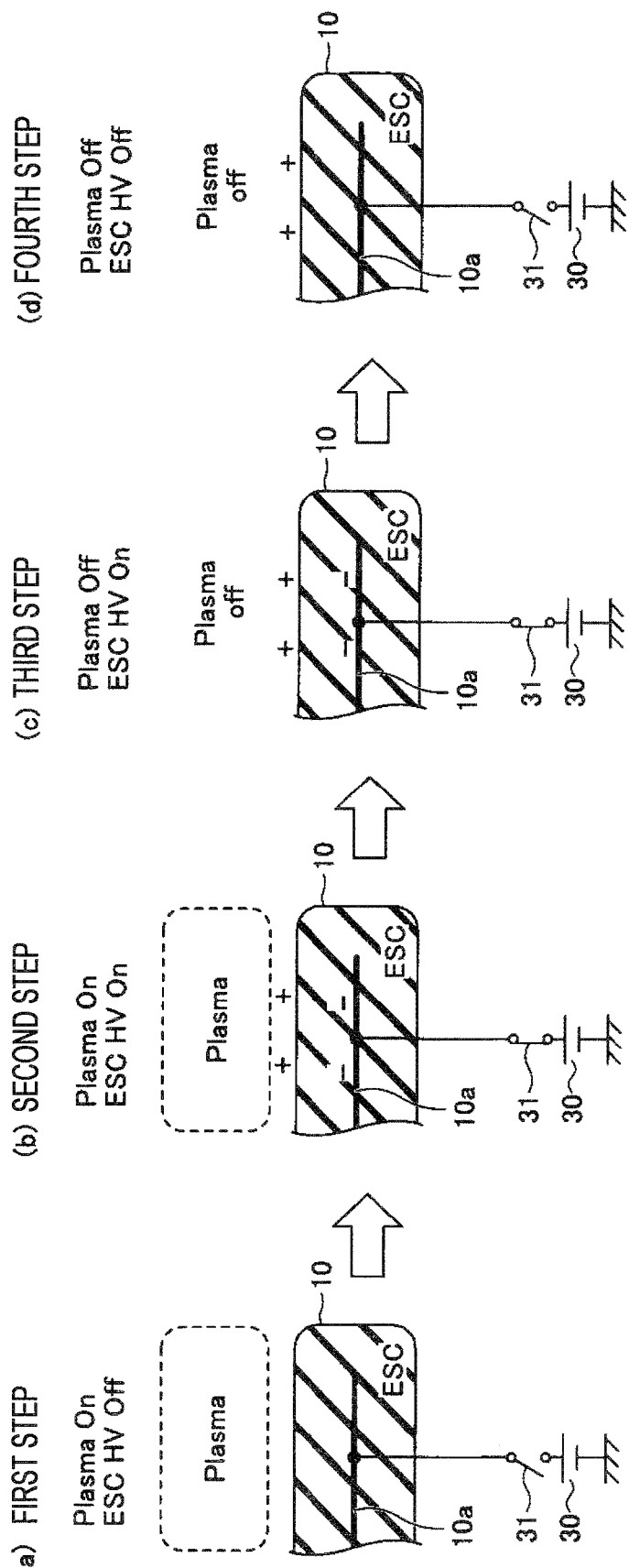
FIG. 5 is a view for explaining a state of an attraction force during precharge according to the exemplary embodiment.

In the first step (a) in FIG. 5, plasma is generated. Meanwhile, the switch 31 is turned off, and a DC voltage HV has not been supplied from the DC power supply 30.

2. Second Step

In the second step (b) in FIG. 5, in a state where the plasma is generated, the switch 31 is turned on, and the DC voltage HV is supplied from the DC power supply 30 to the chuck electrode 10a. In the second step (b), the DC voltage HV having a negative polarity is applied to the chuck electrode 10a, and negative charges occur in the chuck electrode 10a. Thus, to the front surface of the electrostatic chuck 10, positive charges are supplied from the plasma side to neutralize the negative charges occurring in the chuck electrode.

Meanwhile, a DC voltage HV having a positive polarity may be applied to the chuck electrode 10a as long as the DC voltage HV has a positive or negative polarity opposite to that of a DC voltage HV to be applied during the attraction of a subsequent wafer W. The potential of the DC voltage HV applied in the second step may or may not be the same as that of the DC voltage HV to be applied during the attraction of the subsequent wafer W.

3. Third Step

In the third step (c) in FIG. 5, the application of the high frequency power HF for plasma generation is stopped, and the plasma is extinguished. In a state where the positive charges are supplied to the front surface of the electrostatic chuck 10 from the plasma side in the second step, when the plasma is extinguished, the charges charged on the front surface of the electrostatic chuck 10 may not be discharged via the plasma, and thus remain charged on the front surface of the electrostatic chuck 10.

4. Fourth Step

In the fourth step (d) in FIG. 5, the application of the DC voltage HV is stopped. Since the application of the DC voltage HV is stopped in a state where the charges are charged on the front surface of the electrostatic chuck 10, a state where the charges are charged on the front surface of the electrostatic chuck 10, that is, a precharged state is made.

After the wafer is placed in this state, as illustrated in (b-3) of FIG. 2, a DC voltage HV having a polarity (here, a positive polarity) opposite to that during the precharge is applied from the DC power supply 30 to the chuck electrode 10a, and thus, an attraction force occurs according to an amount of charges obtained by adding the positive charges charged on the front surface of the electrostatic chuck 10 to an amount of the charges charged during the precharge.

In this manner, since the precharge is performed in the present exemplary embodiment, the attraction force between the rear surface of the wafer W and the front surface of the electrostatic chuck 10 increases. As a result, in the electrostatic attraction method according to the present exemplary embodiment, it is possible to increase the attraction force of the electrostatic chuck 10, thereby preventing the leakage of a heat transfer gas.

Modification of First Exemplary Embodiment

[Electrostatic Attraction Process]

Figure 6:
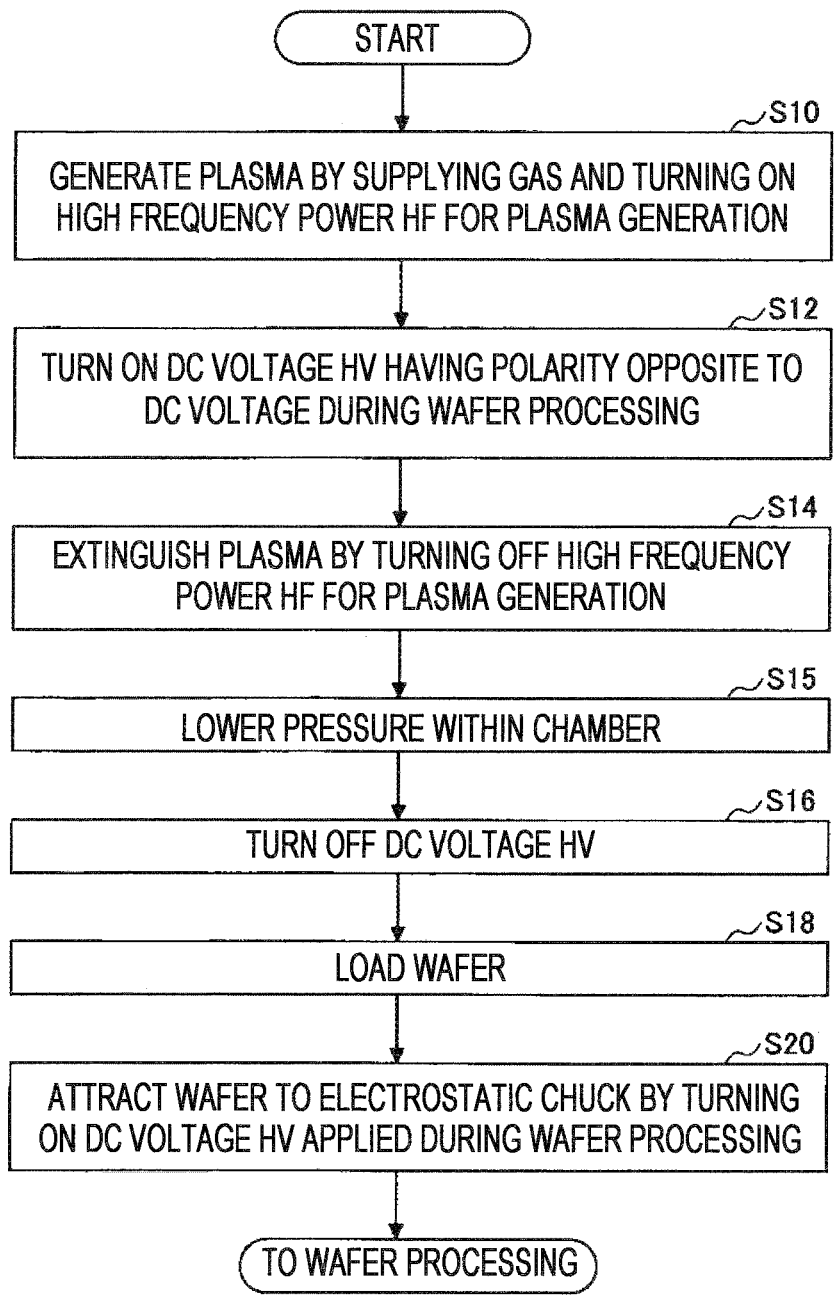
FIG. 6 is a flow chart illustrating an example of an electrostatic attraction process of a wafer according to a modification of the first exemplary embodiment.

Next, an example of an electrostatic attraction process according to a modification of the first exemplary embodiment will be described with reference to FIG. 6. FIG. 6 is a flow chart illustrating an example of the electrostatic attraction process according to the modification of the first exemplary embodiment. This process is executed in the plasma processing apparatus 1 configured as described above, and is controlled by the CPU 105 of the control device 100.

In each processing in FIG. 6, a step in which the same processing as that in the first exemplary embodiment in FIG. 3 is performed is denoted by the same step number, and explanations thereof will be simplified. The electrostatic attraction process according to the modification of the first exemplary embodiment is different from the electrostatic attraction process according to the first exemplary embodiment only in that a processing of a pressure control in step S15 is added to steps S10, S12, S14, S16, S18, and S20 in the electrostatic attraction process according to the first exemplary embodiment.

In the present modification, after the plasma is extinguished in step S14, before the application of the DC voltage HV is stopped in step S16, a control of lowering the pressure inside the chamber 2 is performed (step S15). The processings in steps S14 and S15 correspond to an example of a third step.

The steps S10 to S16 according to the modification of the first exemplary embodiment, as described above, correspond to an example of plasma precharge. In the present modification, the pressure control in FIG. 4 is added, and then the plasma precharge is performed by performing the pressure control in the third step.

1. First Step

A high frequency power HF for plasma generation is applied to generate plasma.

2. Second Step

To the electrostatic chuck 10, a DC voltage HV having a polarity opposite to that of a DC voltage HV to be applied during the attraction of a subsequent wafer W is applied. In FIG. 4, a DC voltage HV having a negative polarity has been applied.

3. Third Step

The application of the high frequency power HF for plasma generation is stopped, and plasma is extinguished. The internal pressure of the chamber 2 is controlled to be low at the same time as or after the application of the high frequency power HF for plasma generation is stopped, before the fourth step.

4. Fourth Step

The application of the DC voltage HV is stopped.

As described above, in the electrostatic attraction process according to the modification of the first exemplary embodiment, as in the first exemplary embodiment, charges may be precharged on the front surface of the electrostatic chuck 10 immediately before the wafer W is loaded, through the plasma precharge. This may increase an attraction force of the electrostatic chuck 10, thereby preventing a leakage of a heat transfer gas.

In the present modification, in the third step, the plasma is extinguished, and the internal pressure of the chamber 2 is controlled to be low. Accordingly, in the third step, by extinguishing the plasma and controlling the internal pressure of the chamber 2 to be low, it is possible to suppress the charges charged on the front surface of the electrostatic chuck 10 from moving through the plasma or a gas within the chamber 2.

Meanwhile, in order to further improve an effect of the pressure control according to the modification, in the third step, it is desirable to control the internal pressure of the chamber 2 to be low as soon as possible at the same time as the application of the high frequency power HF for plasma generation is stopped or after the application of the high frequency power HF is stopped.

Second Exemplary Embodiment

[Electrostatic Attraction Process]

Figure 7:
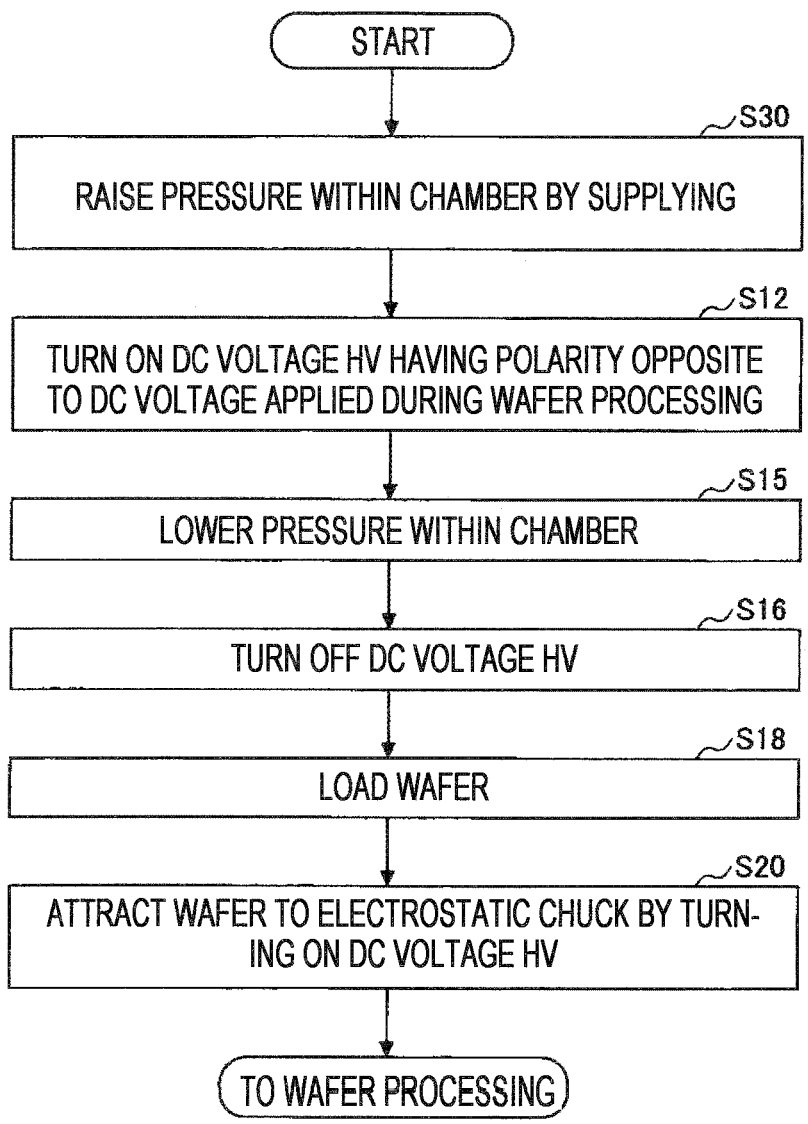
FIG. 7 is a flow chart illustrating an example of an electrostatic attraction process of a wafer according to a second exemplary embodiment.

Next, an example of an electrostatic attraction process according to a second exemplary embodiment will be described with reference to FIG. 7. FIG. 7 is a flow chart illustrating an example of the electrostatic attraction process according to the second exemplary embodiment. In each processing in FIG. 7, a step in which the same processing as that in the first exemplary embodiment in FIG. 3 or the modification of the first exemplary embodiment in FIG. 6 is performed is denoted by the same step number, and explanations thereof will be simplified. The electrostatic attraction process according to the second exemplary embodiment is different from the electrostatic attraction process according to the first exemplary embodiment and the modification thereof in that precharge is performed without generating plasma.

When this process starts, an inert gas such as, for example, an argon gas is supplied from the gas supply source 23 to increase the pressure within the chamber 2 (step S30). Here, a high frequency power HF is not applied, and plasma is not generated. The processing in step S30 is an example of a first step.

After step S30, the DC power supply 30 applies a DC voltage HV having a polarity opposite to that of a DC voltage HV to be applied from the DC power supply 30 when a wafer W is attracted, to the electrostatic chuck 10 (step S12). Then, the pressure within the chamber 2 is lowered (step S15). The processing in step S15 is an example of a third step.

After step S15, the DC power supply 30 stops the application of the DC voltage HV (step S16). Next, the wafer W is carried into the chamber 2 (step S18), and the DC power supply 30 applies a predetermined DC voltage HV to be applied at the attraction of the wafer W, to the electrostatic chuck 10, so that the wafer W is attracted to the electrostatic chuck 10 (step S20). After the processing in step S20, this process is ended.

As described above, in the electrostatic attraction process according to the second exemplary embodiment, in step S30, plasma is not generated, and the pressure within the chamber 2 is controlled to be high. Accordingly, although the plasma is not generated, it is possible to promote movement of charges through a gas within the chamber 2.

In the third step, since the pressure within the chamber 2 is controlled to be low, it is possible to prevent the charges charged on the front surface of the electrostatic chuck 10 from moving through the gas within the chamber 2. Accordingly, in the second exemplary embodiment, it is possible to precharge charges on the front surface of the electrostatic chuck 10 by controlling the pressure within the chamber 2 without generating plasma immediately before the wafer W is loaded. This may increase an attraction force of the electrostatic chuck 10, thereby preventing a leakage of a heat transfer gas.

[Experimental Effect]

Figure 8:
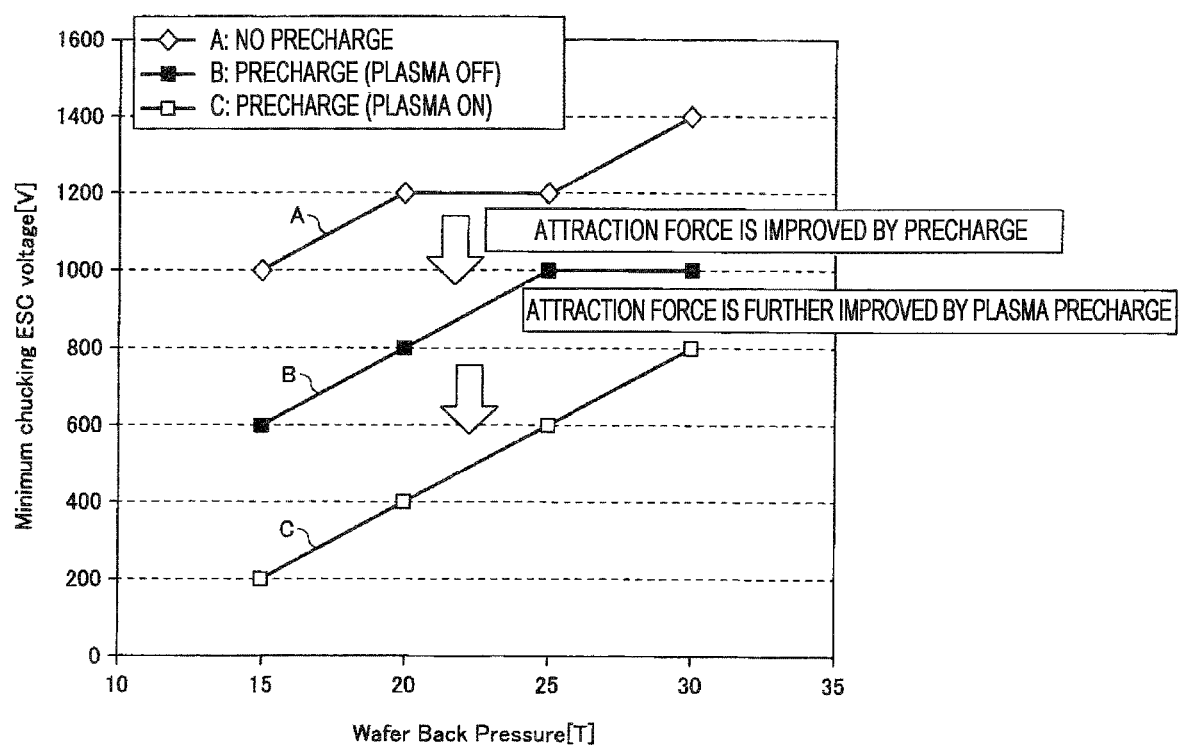
FIG. 8 is a view illustrating an example of an effect of precharge according to the exemplary embodiment.

Finally, descriptions will be made on an effect of precharge in the electrostatic attraction process according to the first and second exemplary embodiments and the modification thereof, with reference to FIG. 8. FIG. 8 illustrates an example of an effect of precharge according to the exemplary embodiment.

The horizontal axis in FIG. 8 indicates a pressure [Torr] of a heat transfer gas supplied to the rear surface of a wafer W, and the vertical axis indicates a minimum DC voltage HV [V] applied to the electrostatic chuck 10 to electrostatically attract the wafer W with respect to each pressure of the heat transfer gas. Meanwhile, 1 [T] is converted to 133.322 [Pa].

The curve A in FIG. 8 indicates a minimum attraction voltage [a DC voltage HV] required for attracting a wafer W with respect to a pressure of the heat transfer gas on the horizontal axis when precharge according to the present exemplary embodiment is not performed.

The curve B in FIG. 8 indicates a minimum attraction voltage required for attracting a wafer W with respect to a pressure of the heat transfer gas on the horizontal axis when precharge according to the second exemplary embodiment is performed. This is a case when precharge is performed in a state where plasma is not generated (plasma OFF).

The curve C in FIG. 8 indicates a minimum attraction voltage required for attracting a wafer W with respect to a pressure of the heat transfer gas on the horizontal axis when precharge according to the modification of the first exemplary embodiment is performed. This is a case when precharge (plasma precharge) is performed in a state where plasma is generated (plasma ON).

In this experiment, negative charges have been applied at a DC voltage HV during the precharge, and then a positive voltage is applied during the present experiment. As a result, through a comparison of the curve A to the curves B and C, it can be found that a minimum attraction voltage is reduced by the precharge. That is, when the precharge is executed, unlike in the case where the precharge is not performed, it is possible to attract a wafer W to the electrostatic chuck 10 by a Coulomb force through the precharge even when a minimum attraction voltage [a DC voltage HV] is reduced. As described above, it can be proved that the precharge may increase an attraction force of the electrostatic chuck 10.

It can be found that, in the comparison of the curve B to the curve C, as compared to that in the case of precharge without plasma generation, in precharge with plasma generation, the amount of charges charged on the front surface of the electrostatic chuck 10 by precharge is larger, and attraction is made even when a minimum attraction voltage [a DC voltage HV] is further reduced.

This is because through performing of precharge in the plasma, it was possible to more effectively promote the movement of charges, and thus increase the amount of charges precharged on the front surface of the electrostatic chuck 10, as compared to the precharge without plasma generation.

Meanwhile, in FIG. 8, there is no experiment result corresponding to precharge according to the first exemplary embodiment, but it is also predicted from the curve C that a minimum attraction voltage is reduced by precharge.

As described above, in the electrostatic attraction method according to each of the present exemplary embodiments and the modification thereof, an attraction force of the electrostatic chuck 10 may be increased by precharge. Accordingly, a leakage of a heat transfer gas may be prevented. Particularly, due to plasma precharge, an attraction force of the electrostatic chuck 10 may be effectively increased, thereby more reliably preventing a leakage of a heat transfer gas.

Meanwhile, the first step in the electrostatic attraction method according to each of the present exemplary embodiments and the modification thereof may be performed after waferless dry cleaning (WLDC). When the front surface of the electrostatic chuck 10 is charged after the front surface of the electrostatic chuck 10 is cleaned by the waferless dry cleaning, it is possible to electrostatically attract a following wafer while maintaining the precharged charges on the front surface of the electrostatic chuck 10. This may improve the effect of the precharge.

A DC voltage HV to be applied during the precharge may need to have a positive or negative polarity opposite to that of a DC voltage HV to be applied during the processing of a wafer, but the magnitudes of potentials may not be the same. However, the higher the potential of the DC voltage HV applied during the precharge, the higher the effect of the precharge.

The electrostatic attraction method according to each of the present exemplary embodiments and the modification thereof may be applied each time immediately before a new wafer W is carried into the chamber 2, or may be applied according to a processing condition or a size of a wafer W which is thought to require a high attraction force for the electrostatic chuck 10.

As an example of a condition that is thought to require a high attraction force for the electrostatic chuck 10, there is a case where the state of the rear surface of a wafer W is unstable. For example, when a conductive deposit adheres to the rear surface of the wafer W, charges move through the conductive deposit. Then, charges on the rear surface of the wafer W may move from the conductive deposit to the electrostatic chuck 10 side. As a result, a Coulomb force between the rear surface of the wafer W and the front surface of the electrostatic chuck 10 may be reduced, thereby reducing the attraction force of the electrostatic chuck 10. In this case, in the plasma processing apparatus 1 according to the present exemplary embodiment, it is desirable to execute a sequence of the electrostatic attraction method according to each of the exemplary embodiments and the modification thereof.

The processing apparatus according to the present disclosure may be applicable to any type among capacitively coupled plasma (CCP), inductively coupled plasma (ICP), radial line slot antenna, electron cyclotron resonance plasma (ECR), and helicon wave plasma (HWP). The processing apparatus according to the present disclosure is not limited to a plasma processing apparatus, but may be any processing apparatus that processes a processing target object.

In the present specification, as an example of a processing target object, a semiconductor wafer W has been described as an example. However, the processing target object is not limited thereto, but may be, for example, various substrates used for a liquid crystal display (LCD) or a flat panel display (FPD), a photomask, a CD substrate, or a printed board.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. An electrostatic attraction method comprising:
   introducing a gas into a processing chamber before a processing target object is carried into a stage within the processing chamber, to generate plasma by applying a high frequency power;
   applying a first DC voltage having a polarity opposite to a polarity of a DC voltage to be applied when attracting the processing target object, to an electrostatic chuck provided on the stage after the introducing the gas into the processing chamber but before carrying the processing target object into the stage of the processing chamber;
   extinguishing the plasma by stopping application of the high frequency power after applying the first DC voltage;
   stopping application of the first DC voltage after the extinguishing the plasma, and
   after the stopping application of the first DC voltage, carrying the processing target object into the processing chamber, and applying a second DC voltage, having a polarity opposite to the polarity of the first DC voltage applied in the applying the first DC voltage, to the electrostatic chuck, so that the processing target object is attracted to the electrostatic chuck.

2. The electrostatic attraction method according to claim 1, wherein the first DC voltage applied in the applying the first DC voltage has a negative polarity.

3. The electrostatic attraction method according to claim 2, wherein the second DC voltage applied in the applying the second DC voltage has a positive polarity.

4. The electrostatic attraction method according to claim 1, wherein the high frequency power applied in the introducing the gas into the processing chamber is a high frequency power for plasma generation.

5. The electrostatic attraction method according to claim 1, wherein a pressure within the processing chamber is lowered simultaneously when or after the application of the high frequency power is stopped in the extinguishing the plasma and before the stopping application of the first DC voltage.

6. The electrostatic attraction method according to claim 1, wherein the introducing the gas into the processing chamber is performed after a wafer-less dry cleaning.

7. An electrostatic attraction method comprising:
   introducing a gas is introduced into a processing chamber before a processing target object is carried into a stage within the processing chamber, to generate plasma by applying a high frequency power;
   applying a first DC voltage having a polarity opposite to a polarity of a DC voltage to be applied when attracting the processing target object, to an electrostatic chuck provided on the stage after the introducing the gas into the processing chamber;
   extinguishing the plasma by stopping application of the high frequency power after the applying the first DC voltage;
   stopping application of the first DC voltage after the extinguishing the plasma;
   after the stopping application of the first DC voltage, carrying the processing target object into the stage of the processing chamber; and
   applying a second DC voltage having a polarity opposite to the polarity of the first DC voltage applied in the applying the first DC voltage, to the electrostatic chuck so that the processing target object is attracted to the electrostatic chuck.

8. The electrostatic attraction method according to claim 7, wherein the first DC voltage applied in the applying the first DC voltage has a negative polarity.

9. The electrostatic attraction method according to claim 8, wherein the second DC voltage applied in the applying the second DC voltage has a positive polarity.

10. The electrostatic attraction method according to claim 7, wherein a pressure within the processing chamber is lowered simultaneously when or after the application of the high frequency power is stopped in the extinguishing the plasma and before the stopping application of the first DC voltage.

11. An electrostatic attraction method comprising:
    introducing a gas into a processing chamber before a processing target object is carried into a stage within the processing chamber, while increasing a pressure within the processing chamber;
    applying a first DC voltage having a polarity opposite to a polarity of a DC voltage to be applied when attracting the processing target object, to an electrostatic chuck provided on the stage after the introducing the gas into the processing chamber but before carrying the processing target object into the stage of the processing chamber;
    lowering the pressure within the processing chamber after the applying the first DC voltage;
    stopping application of the first DC voltage after the lowering the pressure within the processing chamber; and
    after the stopping application of the first DC voltage, carrying the processing target object into the stage of the processing chamber, and applying a second DC voltage having a polarity opposite to the polarity of the first DC voltage applied in the applying the first DC voltage, to the electrostatic chuck, so that the processing target object is attracted to the electrostatic chuck.

12. The electrostatic attraction method according to claim 11, wherein the first DC voltage applied in the applying the first DC voltage has a negative polarity.

13. The electrostatic attraction method according to claim 12, wherein the second DC voltage applied in the applying the second DC voltage has a positive polarity.

14. The electrostatic attraction method according to claim 11, wherein the introducing the gas into the processing chamber is performed after a wafer-less dry cleaning.

* * * * *